United States Patent
Kao

(10) Patent No.: US 9,543,190 B2
(45) Date of Patent: Jan. 10, 2017

(54) METHOD OF FABRICATING SEMICONDUCTOR DEVICE HAVING A TRENCH STRUCTURE PENETRATING A BURIED LAYER

(71) Applicant: UNITED MICROELECTRONICS CORP., Hsin-Chu (TW)

(72) Inventor: Ching-Hung Kao, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/732,800

(22) Filed: Jun. 8, 2015

(65) Prior Publication Data
US 2015/0270162 A1    Sep. 24, 2015

Related U.S. Application Data

(62) Division of application No. 13/369,296, filed on Feb. 9, 2012, now Pat. No. 9,093,296.

(51) Int. Cl.

| H01L 21/78 | (2006.01) |
|---|---|
| H01L 29/66 | (2006.01) |
| H01L 29/78 | (2006.01) |
| H01L 21/762 | (2006.01) |
| H01L 29/06 | (2006.01) |
| H01L 29/08 | (2006.01) |
| H01L 21/265 | (2006.01) |

(Continued)

(52) U.S. Cl.
CPC ..... *H01L 21/76283* (2013.01); *H01L 21/2652* (2013.01); *H01L 21/308* (2013.01); *H01L 21/30604* (2013.01); *H01L 21/31055* (2013.01); *H01L 29/0653* (2013.01); *H01L 29/0878* (2013.01); *H01L 29/66689* (2013.01); *H01L 29/7816* (2013.01)

(58) Field of Classification Search
CPC .......... H01L 21/76283; H01L 21/2652; H01L 21/31055; H01L 21/30604; H01L 21/308; H01L 29/66689; H01L 29/7824
See application file for complete search history.

(56) References Cited

U.S. PATENT DOCUMENTS

| 4,344,081 A | 8/1982 | Pao |
|---|---|---|
| 4,396,999 A | 8/1983 | Malaviya |

(Continued)

OTHER PUBLICATIONS

Zhu, Folded Gate LDMOS Transistor With Low On-Resistance and High Transconductance IEEE Transactions on Electron Devices, vol. 48, No. 12, Dec. 2001 p. 2917-p. 2928.

(Continued)

*Primary Examiner* — Kevin Parendo
(74) *Attorney, Agent, or Firm* — Winston Hsu; Scott Margo

(57) ABSTRACT

A method of fabricating a semiconductor device is disclosed. The method includes the steps of: providing a semiconductor substrate; forming a buried layer in the semiconductor substrate; forming a deep well having a first conductivity type in the semiconductor substrate, wherein the deep well is disposed on the buried layer; forming a first trench structure in the deep well, wherein the first trench structure extends into the buried layer; and forming a second trench structure in the semiconductor substrate, wherein a depth of the second trench structure is larger than a depth of the buried layer.

9 Claims, 10 Drawing Sheets

(51) Int. Cl.
  *H01L 21/306*      (2006.01)
  *H01L 21/308*      (2006.01)
  *H01L 21/3105*     (2006.01)

(56)              References Cited

U.S. PATENT DOCUMENTS

| | | | |
|---|---|---|---|
| 4,893,160 | A | 1/1990 | Blanchard |
| 4,918,333 | A | 4/1990 | Anderson |
| 4,958,089 | A | 9/1990 | Fitzpatrick |
| 5,040,045 | A | 8/1991 | McArthur |
| 5,268,589 | A | 12/1993 | Dathe |
| 5,296,393 | A | 3/1994 | Smayling |
| 5,326,711 | A | 7/1994 | Malhi |
| 5,346,835 | A | 9/1994 | Malhi |
| 5,430,316 | A | 7/1995 | Contiero |
| 5,436,486 | A | 7/1995 | Fujishima |
| 5,534,721 | A | 7/1996 | Shibib |
| 5,614,750 | A * | 3/1997 | Ellul .............. H01L 21/743 257/386 |
| 5,811,850 | A | 9/1998 | Smayling |
| 5,950,090 | A | 9/1999 | Chen |
| 5,998,301 | A | 12/1999 | Pham |
| 6,066,884 | A | 5/2000 | Krutsick |
| 6,144,538 | A | 11/2000 | Chao |
| 6,165,846 | A | 12/2000 | Carns |
| 6,245,689 | B1 | 6/2001 | Hao |
| 6,277,675 | B1 | 8/2001 | Tung |
| 6,277,757 | B1 | 8/2001 | Lin |
| 6,297,108 | B1 | 10/2001 | Chu |
| 6,306,700 | B1 | 10/2001 | Yang |
| 6,326,283 | B1 | 12/2001 | Liang |
| 6,353,247 | B1 | 3/2002 | Pan |
| 6,388,292 | B1 | 5/2002 | Lin |
| 6,400,003 | B1 | 6/2002 | Huang |
| 6,424,005 | B1 | 7/2002 | Tsai |
| 6,514,830 | B1 | 2/2003 | Fang |
| 6,521,538 | B2 | 2/2003 | Soga |
| 6,614,089 | B2 | 9/2003 | Nakamura |
| 6,713,794 | B2 | 3/2004 | Suzuki |
| 6,762,098 | B2 | 7/2004 | Hshieh |
| 6,764,890 | B1 | 7/2004 | Xu |
| 6,784,060 | B2 | 8/2004 | Ryoo |
| 6,784,490 | B1 | 8/2004 | Inoue |
| 6,819,184 | B2 | 11/2004 | Pengelly |
| 6,822,296 | B2 | 11/2004 | Wang |
| 6,825,531 | B1 | 11/2004 | Mallikarjunaswamy |
| 6,846,729 | B2 | 1/2005 | Andoh |
| 6,855,581 | B2 | 2/2005 | Roh |
| 6,869,848 | B2 | 3/2005 | Kwak |
| 6,894,349 | B2 | 5/2005 | Beasom |
| 6,958,515 | B2 | 10/2005 | Hower |
| 7,015,116 | B1 | 3/2006 | Lo |
| 7,023,050 | B2 | 4/2006 | Salama |
| 7,037,788 | B2 | 5/2006 | Ito |
| 7,075,575 | B2 | 7/2006 | Hynecek |
| 7,091,079 | B2 | 8/2006 | Chen |
| 7,148,540 | B2 | 12/2006 | Shibib |
| 7,214,591 | B2 | 5/2007 | Hsu |
| 7,309,636 | B2 | 12/2007 | Chen |
| 7,323,740 | B2 | 1/2008 | Park |
| 7,358,567 | B2 | 4/2008 | Hsu |
| 7,427,552 | B2 | 9/2008 | Jin |
| 7,550,803 | B1 * | 6/2009 | Huang .............. H01L 29/0653 257/330 |
| 2003/0022460 | A1 | 1/2003 | Park |
| 2004/0018698 | A1 | 1/2004 | Schmidt |
| 2004/0070050 | A1 | 4/2004 | Chi |
| 2005/0227448 | A1 | 10/2005 | Chen |
| 2005/0258496 | A1 | 11/2005 | Tsuchiko |
| 2006/0035437 | A1 | 2/2006 | Mitsuhira |
| 2006/0261407 | A1 | 11/2006 | Blanchard |
| 2006/0270134 | A1 | 11/2006 | Lee |
| 2006/0270171 | A1 | 11/2006 | Chen |
| 2007/0041227 | A1 | 2/2007 | Hall |
| 2007/0045767 | A1 * | 3/2007 | Zhu .............. H01L 23/3677 257/505 |
| 2007/0082440 | A1 | 4/2007 | Shiratake |
| 2007/0132033 | A1 | 6/2007 | Wu |
| 2007/0273001 | A1 | 11/2007 | Chen |
| 2008/0160697 | A1 * | 7/2008 | Kao .............. H01L 29/41741 438/268 |
| 2008/0160706 | A1 | 7/2008 | Jung |
| 2008/0185629 | A1 | 8/2008 | Nakano |
| 2008/0265363 | A1 * | 10/2008 | Gambino .......... H01L 21/76229 257/510 |
| 2008/0296655 | A1 | 12/2008 | Lin |
| 2009/0108348 | A1 | 4/2009 | Yang |
| 2009/0111252 | A1 | 4/2009 | Huang |
| 2009/0159966 | A1 | 6/2009 | Huang |
| 2009/0273030 | A1 * | 11/2009 | Schrems .......... H01L 21/76229 257/337 |
| 2009/0278208 | A1 | 11/2009 | Chang |
| 2009/0294865 | A1 | 12/2009 | Tang |
| 2009/0321875 | A1 * | 12/2009 | Chang .............. H01L 21/76264 257/520 |
| 2010/0006937 | A1 | 1/2010 | Lee |
| 2010/0032758 | A1 | 2/2010 | Wang |
| 2010/0096702 | A1 | 4/2010 | Chen |
| 2010/0148250 | A1 | 6/2010 | Lin |
| 2010/0184295 | A1 | 7/2010 | Sato |
| 2010/0213517 | A1 | 8/2010 | Sonsky |
| 2011/0057263 | A1 | 3/2011 | Tang |
| 2011/0062547 | A1 * | 3/2011 | Onishi ............... H01L 21/764 257/510 |
| 2011/0127602 | A1 | 6/2011 | Mallikarjunaswamy |
| 2011/0175198 | A1 * | 7/2011 | Zhan .............. H01L 27/0259 257/592 |
| 2012/0175727 | A1 * | 7/2012 | Lin .............. H01L 21/743 257/508 |

OTHER PUBLICATIONS

Nakagawa, Improved 20V Lateral Trench Gate Power MOSFETs with Very Low On-resistance of 7.8 mΩ. mm2, ISPSD May 22-25, 2000, Toulouse, France p. 47-p. 50.

* cited by examiner

METHOD OF FABRICATING SEMICONDUCTOR DEVICE HAVING A TRENCH STRUCTURE PENETRATING A BURIED LAYER

CROSS REFERENCE TO RELATED APPLICATIONS

This application is a division of U.S. application Ser. No. 13/369,296 filed Feb. 9, 2012, and incorporated herein by reference in its entirety.

BACKGROUND OF THE INVENTION

1. Field of the Invention

The present invention relates to a semiconductor device and a method of fabricating a semiconductor device, and more particularly, to a semiconductor device having trench structures and a method of fabricating the same.

2. Description of the Prior Art

Having the advantages of a high operational bandwidth, a high operational efficiency, and a planar structure that eases the integration in other integrated circuits, lateral double-diffused metal-oxide-semiconductor (LDMOS) transistor devices are widely used in high operational voltage environments such as CPU power supplies, power management systems, AC/DC converters, and high-power or high frequency (HF) band power amplifiers.

Please refer to FIG. 1. FIG. 1 is a cross-sectional view illustrating a LDMOS transistor device. As shown in FIG. 1, a LDMOS transistor device 10 includes a P-type substrate 11, an N-type well 12 disposed in the substrate 11, a field oxide layer 13 disposed on the substrate 11, a gate 14 disposed on a part of the field oxide layer 13, and a spacer 15 disposed beside the gate 14. A P-type doped region 16 is located in the N-type well 12. The source 17 is located in the P-type doped region 16 at one side of the spacer 15 and the drain 18 is disposed in the N-type well 12 at the other side of the spacer 15. The main characteristics of the LDMOS transistor device are the lateral diffused area having the low dopant concentration and the large area disposed in the drain region that buffers the high voltage signals between the source region and the drain region. Accordingly, LDMOS transistor devices can have a high breakdown voltage (Vbd).

With the trend of miniaturization of the electronic products, how to reduce the occupied area of LDMOS transistor device in the semiconductor substrate without adversely affecting the LDMOS transistor performance is an important issue in this field.

SUMMARY OF THE INVENTION

It is therefore one of the objectives of the present invention to provide a method of fabricating a semiconductor device including trench structures to save the occupied area of LDMOS transistor device in the semiconductor substrate.

According to one exemplary embodiment of the present invention, a semiconductor device is provided. The semiconductor device includes a semiconductor substrate, a buried layer, a deep well, a first doped region, a well, a first heavily doped region, a second heavily doped region, a gate, a first trench structure and a second trench structure. The buried layer and the deep well having a first conductivity type are disposed in the semiconductor substrate, wherein the deep well is disposed on the buried layer. The first doped region having a first conductivity type is disposed in the deep well, wherein the first doped region contacts the buried layer. The well having a second conductivity type is disposed in the deep well. The first heavily doped region having a first conductivity type is disposed in the first doped region; the second heavily doped region having a first conductivity type is disposed in the well; and the gate is disposed on the semiconductor substrate between the first heavily doped region and the second heavily doped region. The first trench structure is disposed in the semiconductor substrate at one side of the gate, wherein the first trench structure contacts the buried layer. The second trench structure is disposed in the semiconductor substrate at the other side of the gate opposite to the first trench structure, wherein a depth of the second trench structure is substantially larger than a depth of the buried layer.

According to another exemplary embodiment of the present invention, the method of forming a semiconductor device includes the following steps. First, a semiconductor substrate is provided, and a buried layer is formed in the semiconductor substrate. Then, a deep well having a first conductivity type is formed in the semiconductor substrate, and the deep well is disposed on the buried layer. Subsequently, a first trench structure is formed in the deep well, wherein the first trench structure extends into the buried layer; and a second trench structure is formed in the semiconductor substrate, wherein a depth of the second trench structure is substantially larger than a depth of the buried layer.

The present invention uses the first trench structure to substitute for the field oxide layer of a conventional semiconductor device such as LDMOS transistor device. Accordingly, a part of the horizontal space occupied by the semiconductor device may be replaced by the vertical space. Therefore, the first trench structure can provide insulation between the gate and the first heavily doped region, and the sufficient vertical space can buffer the high voltage signals transferred from the first heavily doped region to prevent from damaging the semiconductor device. Consequently, in the present invention, the formation of the first trench structure, which contacts and extends into the buried layer, may reduce the horizontal occupied area in the semiconductor substrate, this way the utilization rate of the semiconductor substrate is increased.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
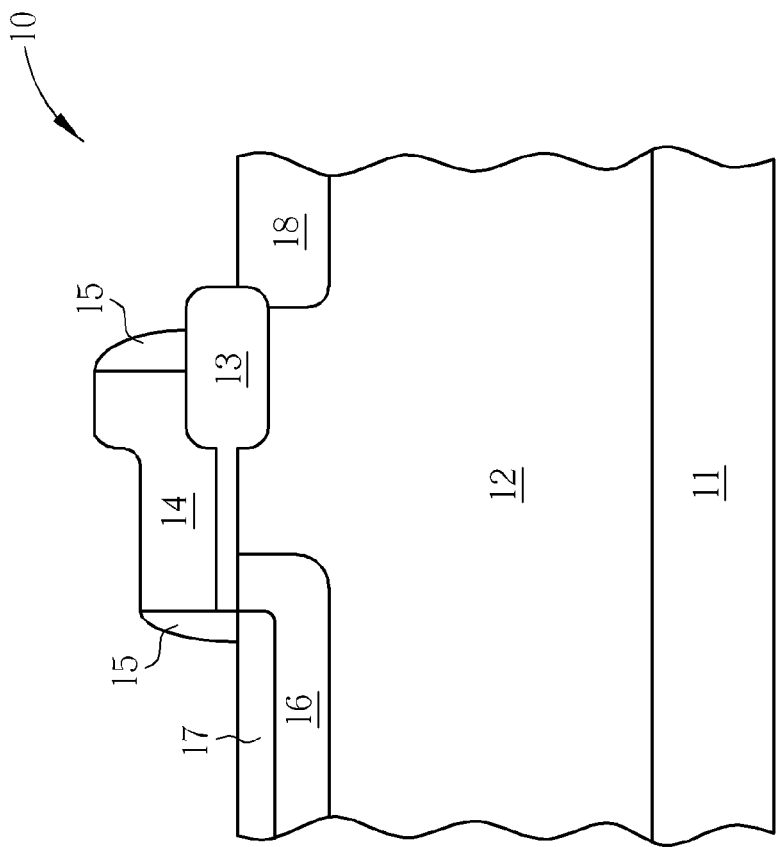
FIG. 1 is a cross-sectional view illustrating a LDMOS transistor device.
Figure 2:
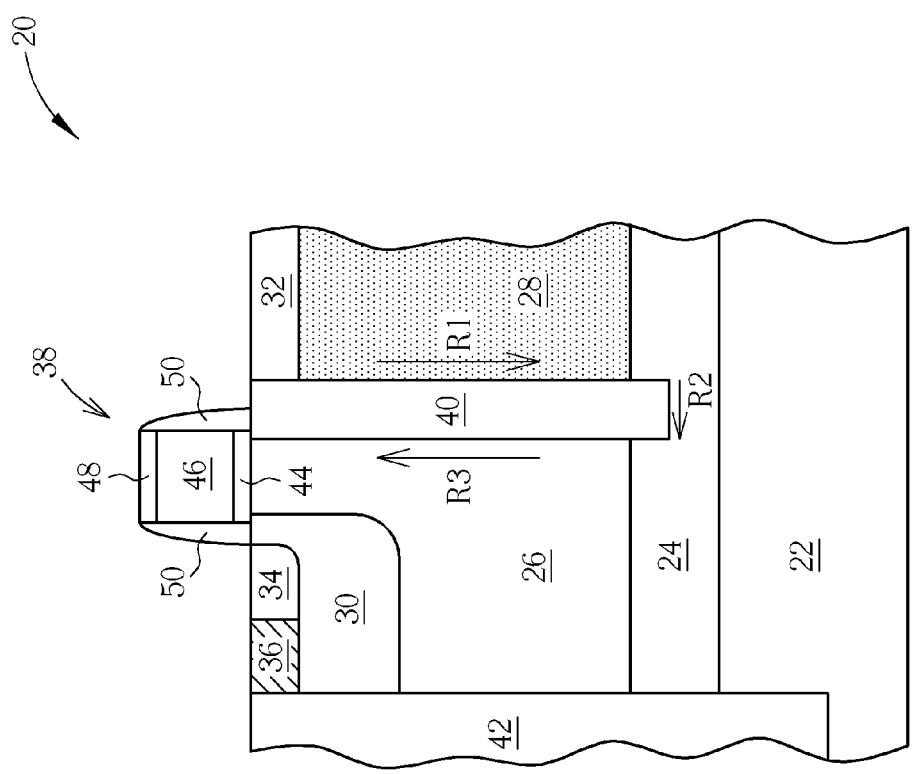
FIG. 2 is a schematic diagram illustrating a semiconductor device according to a preferred exemplary embodiment of the present invention.

The present invention provides a semiconductor device, please refer to FIG. 2. FIG. 2 is a schematic diagram illustrating a semiconductor device according to a preferred exemplary embodiment of the present invention. As shown in FIG. 2, a semiconductor device 20 includes a semiconductor substrate 22, a buried layer 24, a deep well 26, a first doped region 28, a well 30, a first heavily doped region 32, a second heavily doped region 34, a third heavily doped region 36, a gate 38, a first trench structure 40 and a second trench structure 42. The semiconductor substrate 22 may be a substrate composed of gallium arsenide (GaAs), silicon on insulator (SOI) layer, epitaxial layer, SiGe layer or other semiconductor materials. The buried layer 24 is disposed in the semiconductor substrate 22 for insulation purposes, or, for example, to stop the current signal transferring into the semiconductor substrate 22 and avoid the leakage. In this exemplary embodiment, the buried layer 24 could be an N type buried layer, but not limited thereto. The deep well 26 having a first conductivity type is disposed in the semiconductor substrate 22, and the deep well 26 is disposed on the buried layer 24. The semiconductor substrate 22 could further include an epitaxial layer (not shown), and the deep well 26 is disposed in the epitaxial layer, for example, the deep well 26 is disposed in an epitaxial layer having a thickness around 5 micrometers (μm).

The first doped region 28 having a first conductivity type and the well 30 having a second conductivity type are both disposed in the deep well 26, furthermore, the first doped region 28 contacts the buried layer 24, while the well 30 preferably does not contact the buried layer 24, but not limited thereto. The first conductivity type could be n-type or p-type, and the second conductivity type would be the other one. Additionally, the first doped region 28 has a dopant concentration, and the dopant concentration preferably increases progressively from an interface between the first doped region 28 and the buried layer 24 towards an interface between the first doped region 28 and the semiconductor substrate 22. The first heavily doped region 32 and the second heavily doped region 34 have the first conductivity type, the first heavily doped region 32 is disposed in the first doped region 28, and the second heavily doped region 34 is disposed in the well 30. In this exemplary embodiment, the first heavily doped region 32 could be the drain, and the second heavily doped region 34 could be the source. The third heavily doped region 36 disposed in the well 30 has the same conductivity type as the well 30, and the third heavily doped region 36 is used for adjusting the electric potential of the well 30. The gate 38 is disposed on the semiconductor substrate 22 between the first heavily doped region 32 and the second heavily doped region 34. The gate 38 includes a gate dielectric layer 44, a gate conductive layer 46 disposed on the gate dielectric layer 44, a cap layer 48 disposed on the gate conductive layer 46, and a spacer 50. As the materials of the gate 38 are known to those skilled in the art, the details are omitted herein for brevity. Moreover, a part of the well 30 is under the gate 38.

The first trench structure 40 is disposed in the semiconductor substrate 22 at one side of the gate 38 and between the first heavily doped region 32 and the second heavily doped region 34, more clearly, the first trench structure 40 is disposed between the first doped region 28 and the well 30. The first trench structure 40 contacts the buried layer 24, and preferably extends into the buried layer 24 without penetrating the buried layer 24. The second trench structure 42 is disposed in the semiconductor substrate 22 at the other side of the gate 38 opposite to the first trench structure 40. The first trench structure 40 and the second trench structure 42 could be made of insulating material, and the second trench structure 42 may insulate the semiconductor device 20 from the other semiconductor device (not shown) disposed in the semiconductor substrate 22. A width of the first trench structure 40 is substantially smaller than a width of the second trench structure 42. The first trench structure 40 contacts the buried layer 24 without penetrating the buried layer 24, and a depth of the second trench structure 42 is substantially larger than a depth of the buried layer 24, in other words, the bottom side of the second trench structure 42 is under the bottom side of the buried layer 24. Accordingly, a depth of the first trench structure 40 is substantially smaller than a depth of the second trench structure 42.

The semiconductor device 20 could be a lateral double-diffused metal-oxide-semiconductor (LDMOS) transistor device. As the semiconductor device 20 is turned on, the high voltage signal flows in from the first heavily doped region 32. The first trench structure 40 can prevent the high voltage signal from penetrating through the gate dielectric layer 44 and reaching the gate conductive layer 46, which may damage the semiconductor device 20. It is appreciated that, the first trench structure 40 of the present invention vertically extends to contact the buried layer 24, and the disposition of the first trench structure 40 makes the high voltage signal flow along a path R1 on a side of the first trench structure 40, a path R2 in the buried layer 24 and a path R3 on the other side of the first trench structure 40 so as to reach the gate 38, in order to buffer the high voltage signal. Compared to the conventional field oxide layer formed along the horizontal direction, the first trench structure 40 of the present invention may use vertical space to substitute for a portion of horizontal space occupied by the conventional field oxide layer, and therefore increase the utilization rate of the semiconductor substrate 20.

Figure 3:
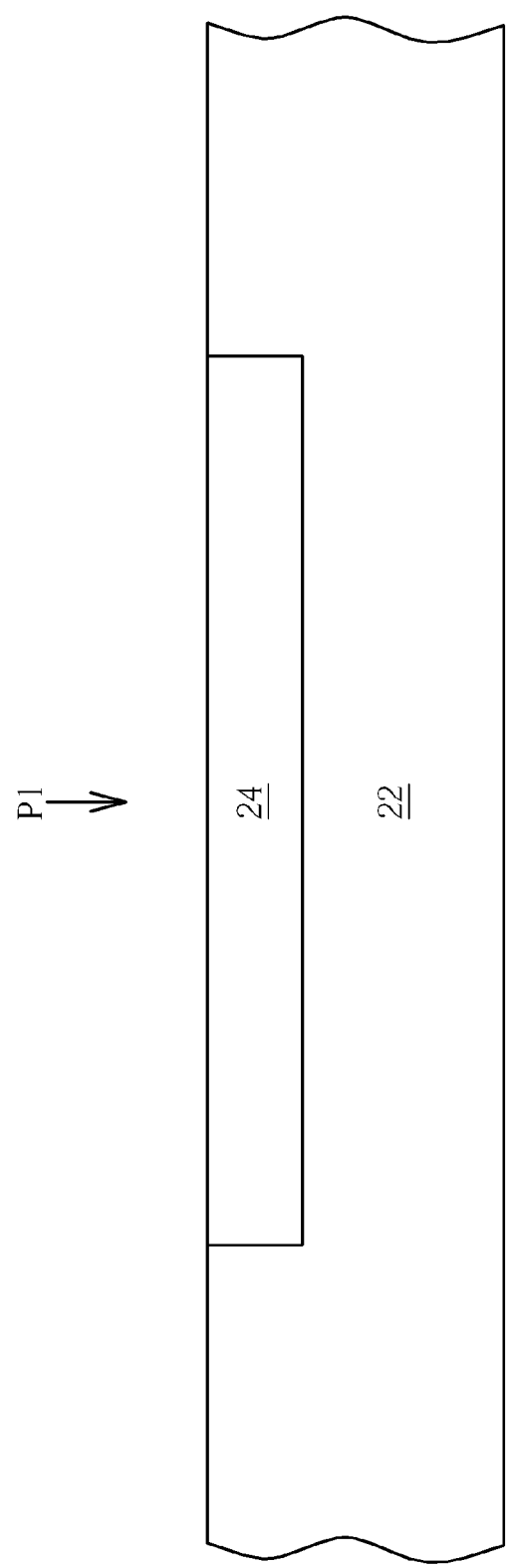
FIG. 3 through FIG. 10 illustrate a method of fabricating a semiconductor device according to a preferred exemplary embodiment of the present invention.
Figure 4:
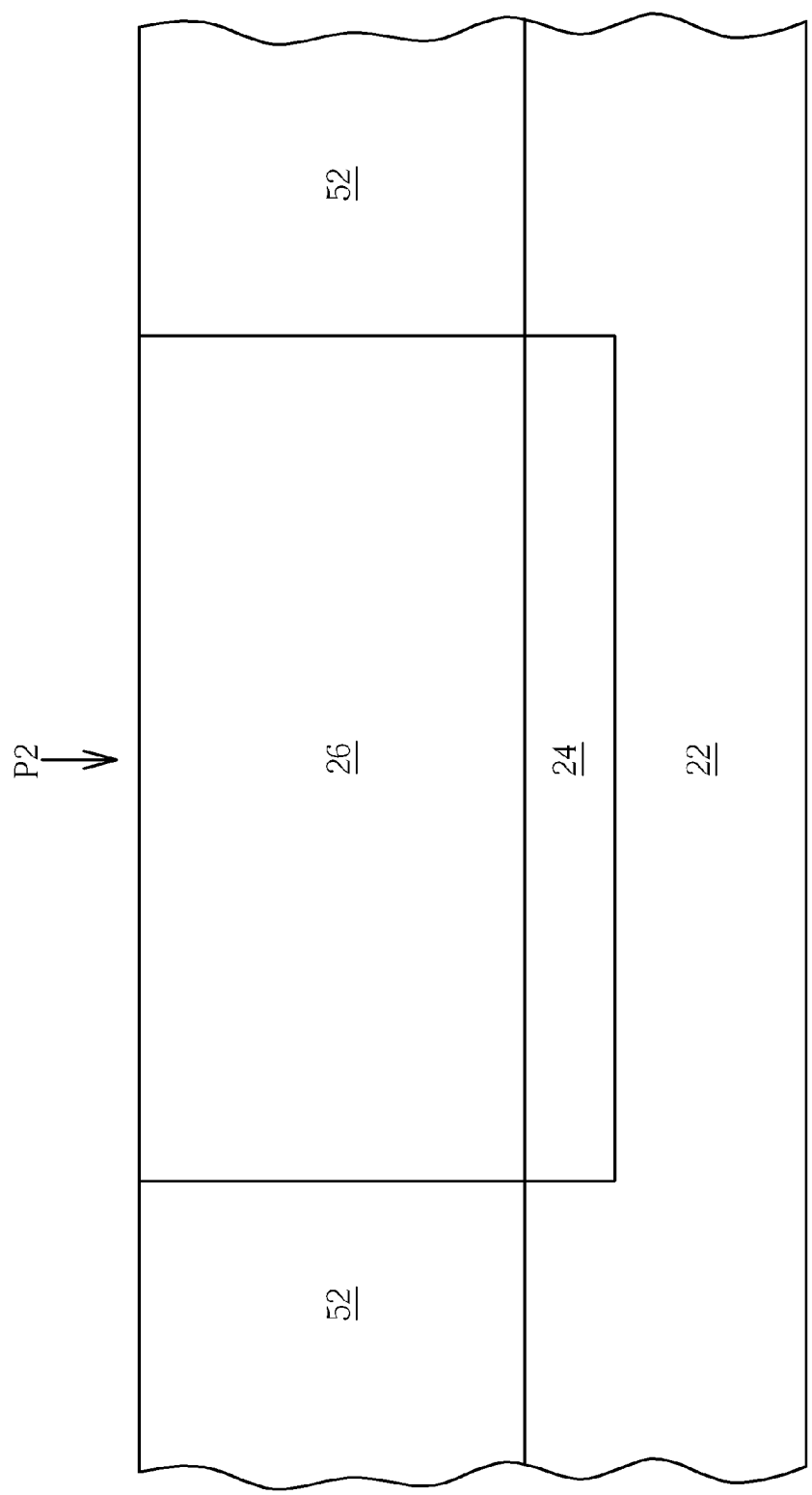

The present invention also provides a method of fabricating a semiconductor device, and more specifically, a method of fabricating the semiconductor device having trench structures with different depths surrounding the gate. Please refer to FIG. 3 through FIG. 10. FIG. 3 through FIG. 10 illustrate a method of fabricating a semiconductor device according to a preferred exemplary embodiment of the present invention. As shown in FIG. 3, a semiconductor substrate 22 is provided, and an ion implantation process P1 is performed to form a buried layer 24 in the semiconductor substrate 22. The semiconductor substrate 22 may be a substrate composed of GaAs, silicon on insulator (SOI) layer, epitaxial layer, SiGe layer or other semiconductor materials, and the buried layer 24 could be an N type buried layer. Then, as shown in FIG. 4, after the formation of the buried layer 24, an epitaxial layer 52 can be further formed on the buried layer 24 to thicken the semiconductor substrate 22 for example; a selective epitaxial growth (SEG) process is performed to form the epitaxial layer 52 having a thickness around 5 μm on the buried layer 24. Subsequently, an ion implantation process P2 is performed to form a deep well 26 having a first conductivity type in the epitaxial layer 52, that is, the deep well 26 is disposed in the semiconductor substrate 22 on the buried layer 24.

Figure 5:
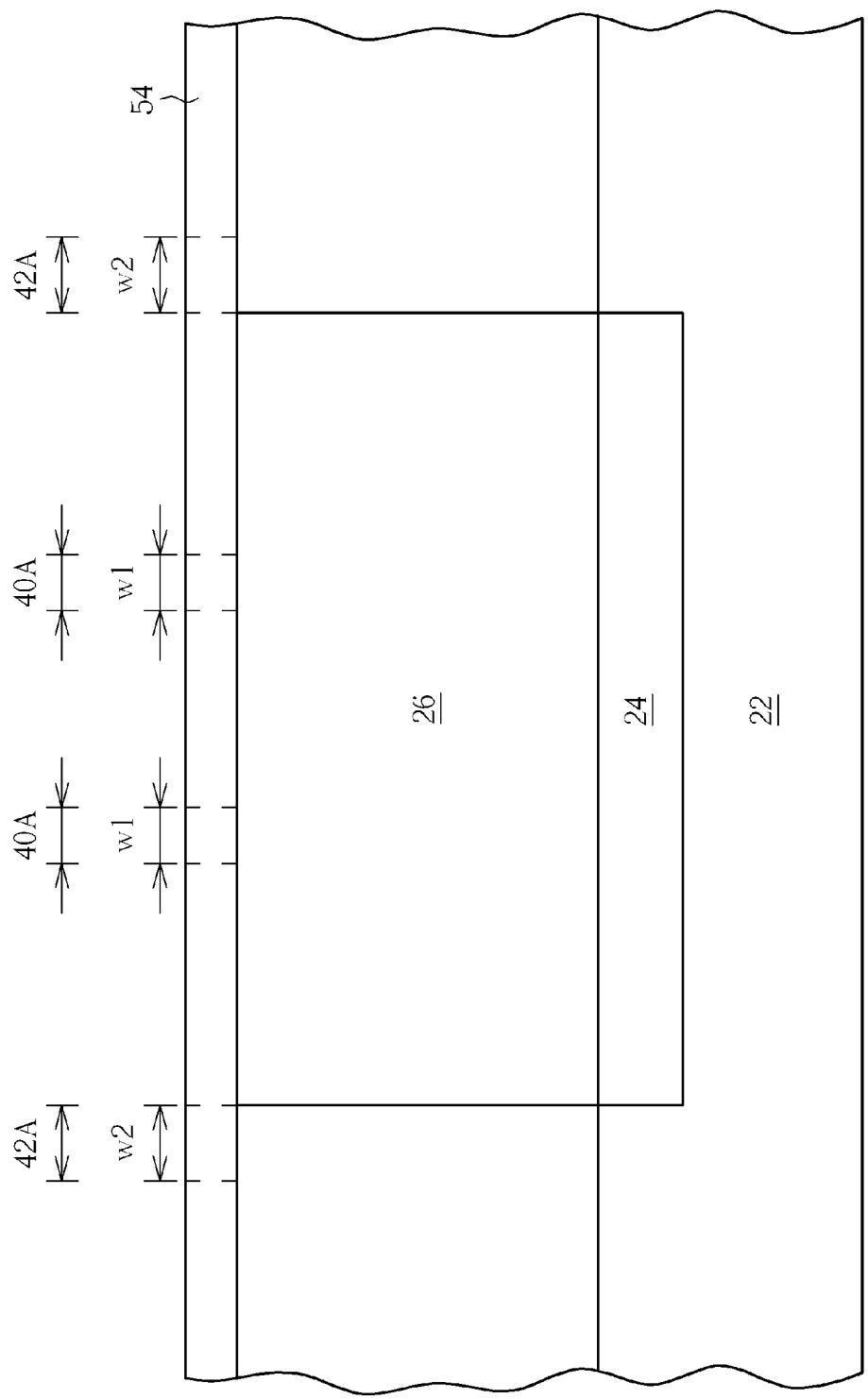
Figure 6:
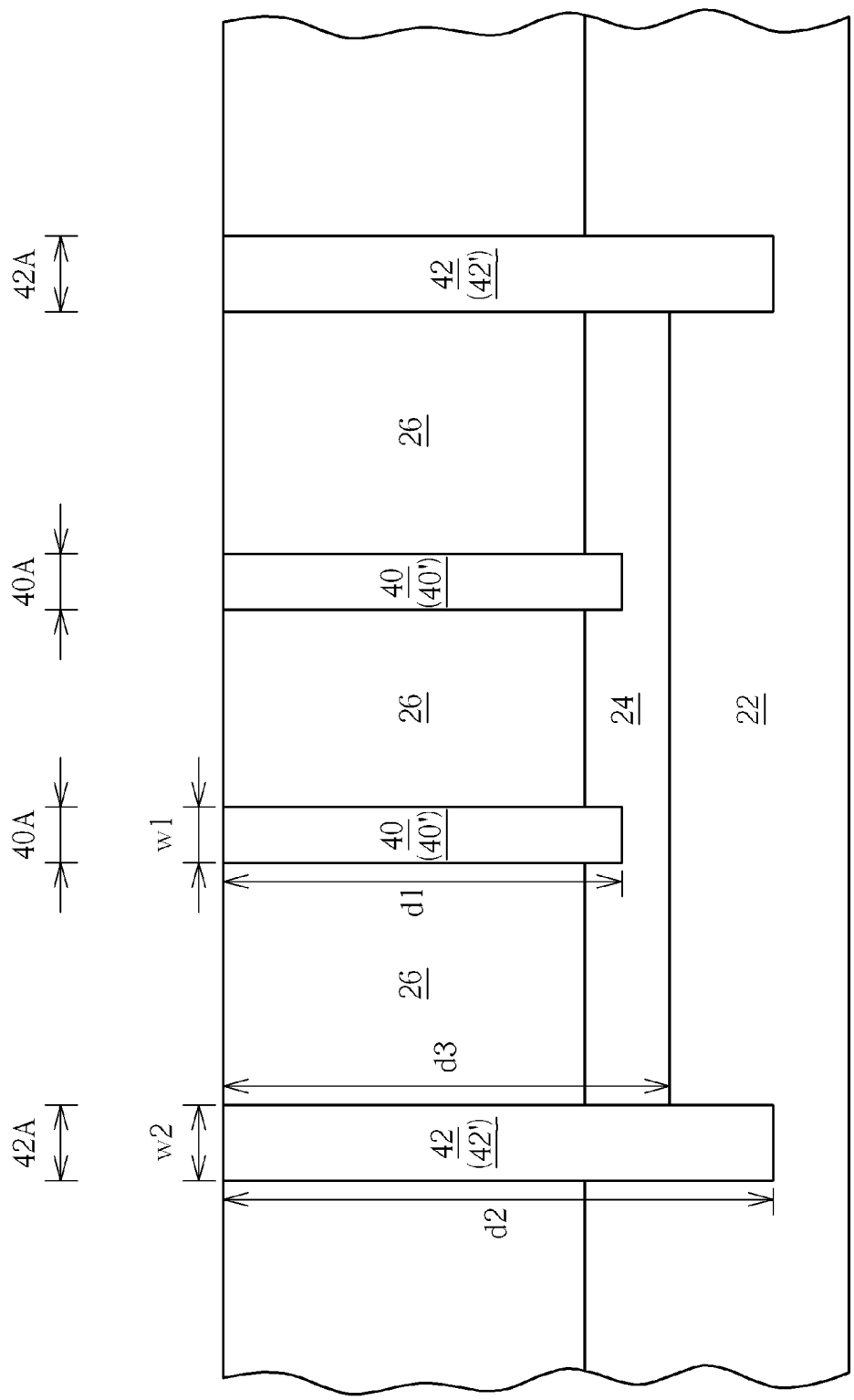

As shown in FIG. 5, a patterned mask 54 is formed on the semiconductor substrate 22 for defining the predetermined locations of the first trench structure (not shown) and the second trench structure (not shown) including a first trench structure region 40A and a second trench structure region 42A. A width w1 of the first trench structure region 40A is substantially smaller than a width w2 of the second trench structure region 42A. The patterned mask 54 could include a mono-layer or composite layers made of silicon oxide or silicon nitride. Then, as shown in FIG. 6, an etching process is performed to transfer the pattern of the patterned mask 54 onto the semiconductor substrate 22 and remove a part of the semiconductor substrate 22 for simultaneously forming at least a first trench 40' and at least a second trench 42' in the semiconductor substrate 22.

It is appreciated that, the width w1 of the first trench structure region 40A is substantially smaller than a width w2 of the second trench structure region 42A. Accordingly, as the etching process is performing, the exposed area of the semiconductor substrate 22 in the first trench structure region 40A is also substantially smaller than the exposed area of the semiconductor substrate 22 in the second trench structure region 42A. Therefore, under the same process conditions, such as the etchant having the same selectivity or the same etching period, a depth d1 of the first trench 40' is substantially smaller than a depth d2 of the second trench 42'. In this exemplary embodiment, a depth d3 of the buried layer 24 is substantially between the depth d1 of the first trench 40' and the depth d2 of the second trench 42'. In summary, the present invention adjust the widths of the trench structure regions where the trench structures are predetermined to be formed simultaneously with different depths in one etching process, and the width of each trench structure region is proportional to the depth of the formed trench.

Subsequently, the first trench 40' and the second trench 42' are filled with insulating materials to forma first trench structure 40 and a second trench structure 42. The method for forming the first trench structure 40 and the second trench structure 42 includes the following steps. First, a thermal oxidation process is selectively performed to oxidize the semiconductor substrate 22 exposed by the first trench 40' and the second trench 42' in order to form an oxide layer (not shown) respectively covering the bottom and the inner sides of the first trench 40' and the bottom and the inner sides of the second trench 42'. The first trench 40' and the second trench 42' are not totally filled with the insulating material. Then, a dielectric layer (not shown) made of oxide is formed for filling the first trench 40' and the second trench 42' through a chemical vapor deposition (CVD) process including high density plasma density CVD (HDPCVD) process, sub atmosphere CVD (SACVD) process, or spin on dielectric (SOD) process. Furthermore, a chemical mechanical polishing (CMP) process is performed to remove the additional oxide layer, the additional dielectric layer and the remaining patterned mask to complete the formation of the first trench structure 40 and the second trench structure 42 as shown in FIG. 6. The first trench structure 40 contacts the buried layer 24 without penetrating it, and the bottom side of the second trench structure 42 is under the bottom side of the buried layer 24. In this exemplary embodiment, the first trench structure 40 surrounds a part of the deep well 26, and the second trench structure 42 enclose the deep well 26 and first trench structure 40, but not limited thereto.

The width of the first trench structure region 40A, the width of the first trench 40', and the width of the first trench structure 40 are substantially the same, and w1 may be used to represent for each of them. Furthermore, the width of the second trench structure region 42A, the width of the second trench 42', and the width of the second trench structure 42 are substantially the same, and w2 may be used to represent for each of them.

Figure 7:
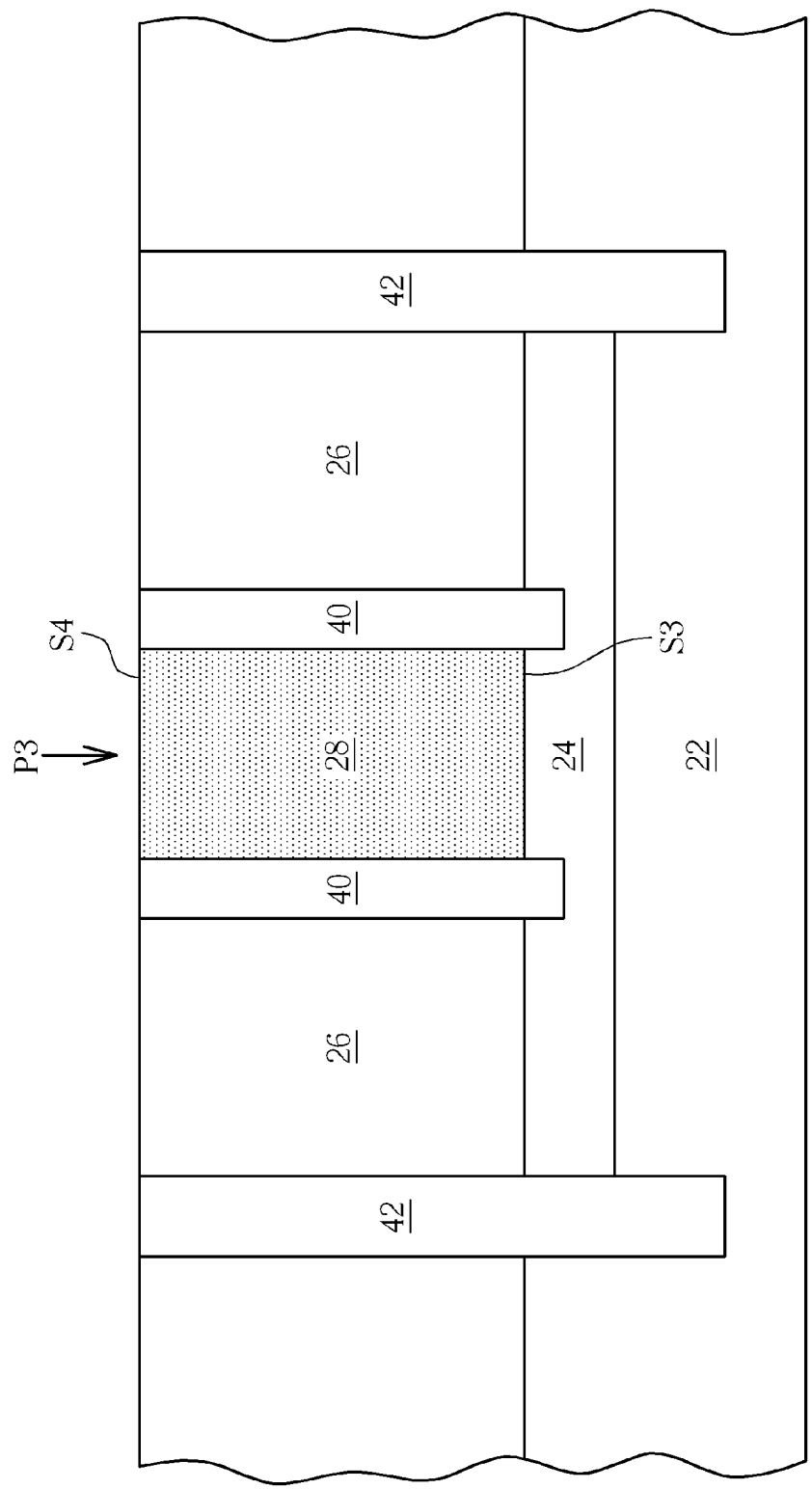

An ion implantation process P3 is further performed to form a first doped region 28 in the deep well 26 at one side of the first trench structure 40, wherein the first doped region 28 has the first conductivity type. As shown in FIG. 7, the ion implantation process P3 is performed with a patterned mask (not shown) to form the first doped region 28 in the deep well 26 surrounded by the first trench structure 40. The first doped region 28 contacts the buried layer 24, additionally, the first doped region 28 has a dopant concentration, and the dopant concentration increases progressively from an interface S3 between the first doped region 28 and the buried layer 24 towards an interface S4 between the first doped region 28 and the semiconductor substrate 22. The ion implantation process P3 includes the following steps. First, dopants having the first conductivity type are implemented into a part of the deep well 26, a thermal process is then performed to drive-in the dopant. In addition, the ion implantation process P3 could also be performed so as to form a plurality of sub-regions (not shown) having different dopant concentrations and different depths, wherein these sub-regions could constitute the first doped region 28 having a dopant concentration gradient. Furthermore, the order of the formation of the first trench structure 40 and the second trench structure 42 and the formation of the first doped region 28 is not limited to the one illustrated above.

Figure 8:
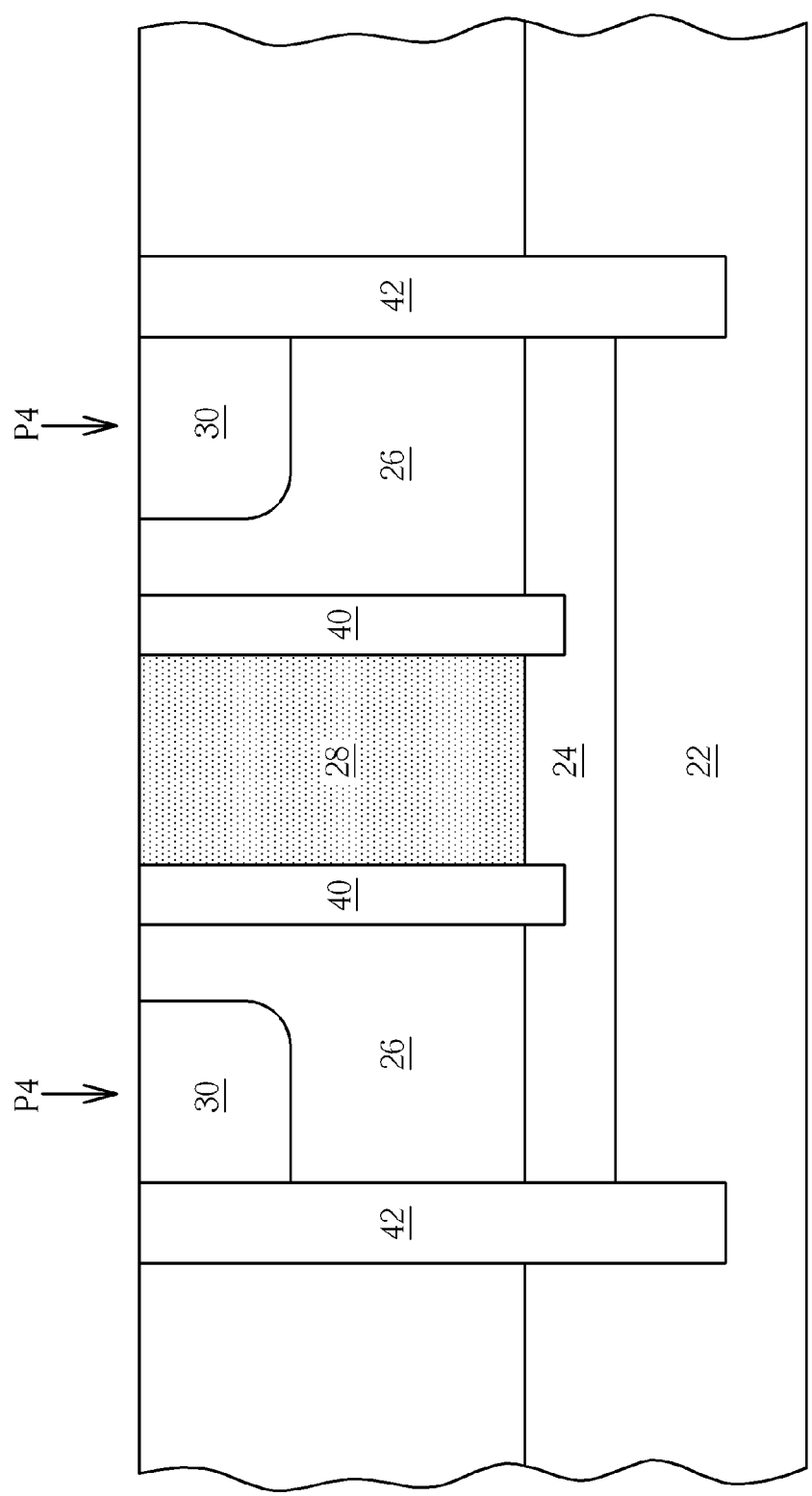

As shown in FIG. 8, an ion implantation process P4 is performed to form a well 30 in the deep well 26 at the other side of the first trench structure 40 opposite to the first doped region 28, and the well 30 has a second conductivity type and preferably does not contact the buried layer 24. The first conductivity type can be n-type or p-type, and the second conductivity type is the other one. In this exemplary embodiment, the first trench structure 40 could be located between the well 30 and the first doped region 28, the first trench structure 40 may surround the first doped region 28, and the second trench structure 42 may surround the deep well 26, the first trench structure 40 and the first doped region 28. The ion implantation process P4 includes the following steps. First, dopants having the second conductivity type are implemented into a part of the deep well 26, then a thermal process is performed to drive-in the dopants. A dopant concentration of the well 30 is substantially equal to a dopant concentration of the deep well 26, but smaller than a dopant concentration of the buried layer 24, but not limited thereto.

Figure 9:
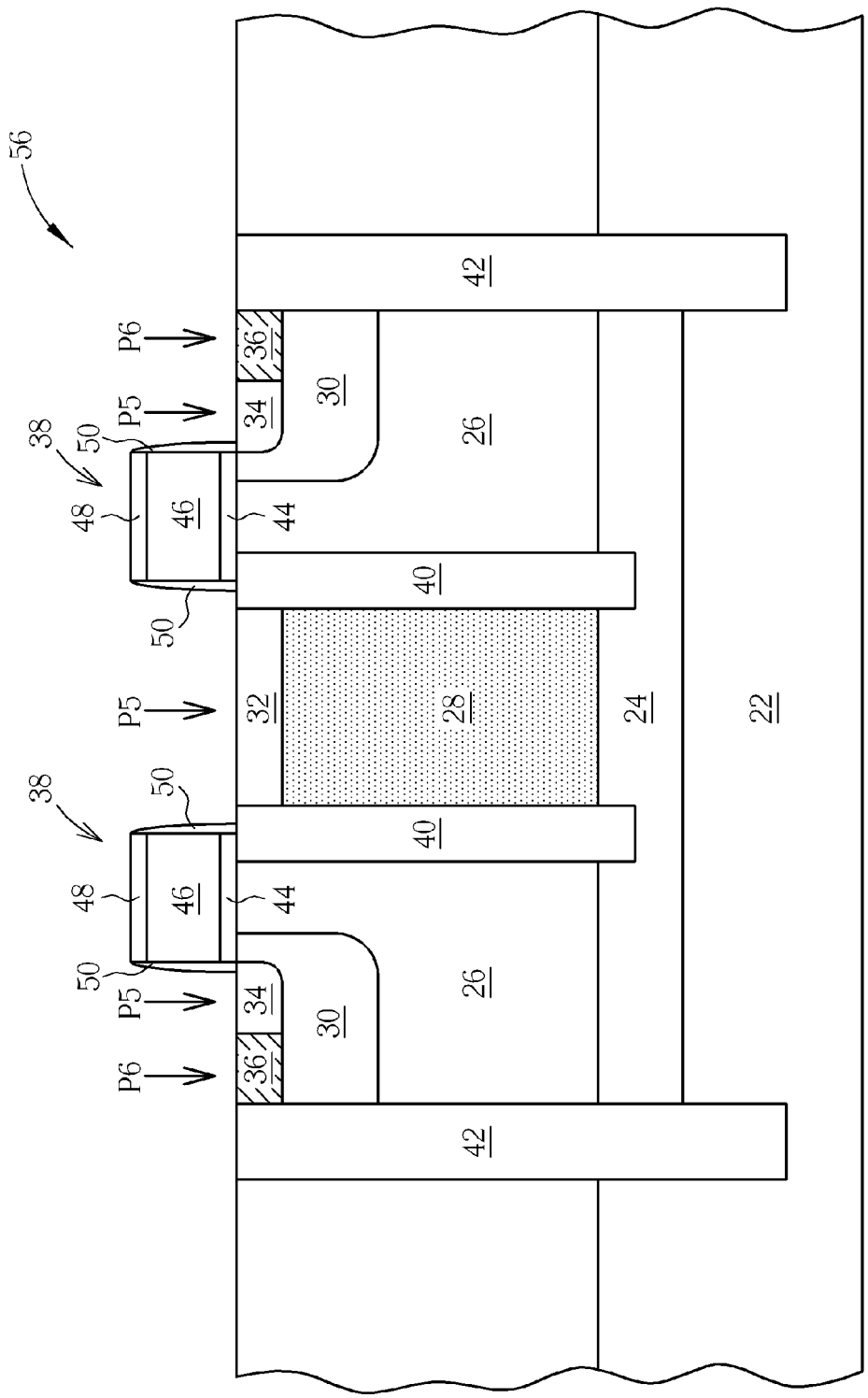

As shown in FIG. 9, at least a gate 38 is formed on the semiconductor substrate 22. The gate 38 includes a gate dielectric layer 44, a gate conductive layer 46, a cap layer 48 and a spacer 50. The fabricating processes of the gate are known to those skilled in the art, therefore the details are omitted herein for brevity. The gate 38 overlaps a part of the deep well 26 between the first trench structure 40 and the second trench structure 42, and a part of the first trench structure 40. Then, at least a first heavily doped region 32 having the first conductivity type is formed in the first doped region 28 and at least a second heavily doped region 34 having the first conductivity type is formed in the well 30. The method of fabricating the first heavily doped region 32 and the second heavily doped region 34 includes the following steps. The gate 38 and a patterned mask (not shown) are used as a mask to perform an ion implantation process P5 to respectively form the first heavily doped region 32 and the second heavily doped region 34 in the semiconductor substrate 22 at both sides of the gate 38. A dopant concentration of the first heavily doped region 32 and a dopant concentration of the second heavily doped region 34 are substantially larger than the dopant concentration of the deep well 26 or a dopant concentration of the well 30. The first trench structure 40 is between the first heavily doped region 32 and the second heavily doped region 34, and the second trench structure 42 is in the semiconductor substrate 22 at the other side of the gate 38, opposite to the first trench structure 40. Furthermore, anion implantation process P6 is further performed to form at least a third heavily doped region 36 in the well 30. The third heavily doped region 36 has the same second conductivity type as the well 30. In this exemplary embodiment, the first heavily doped region 32 may be a communal drain, the second heavily doped region 34 may be a source, and the third heavily doped region 36 may be used to adjust the electric potential of the well 30. Accordingly, a semiconductor device 56 such as LDMOS transistor device is completed.

Figure 10:
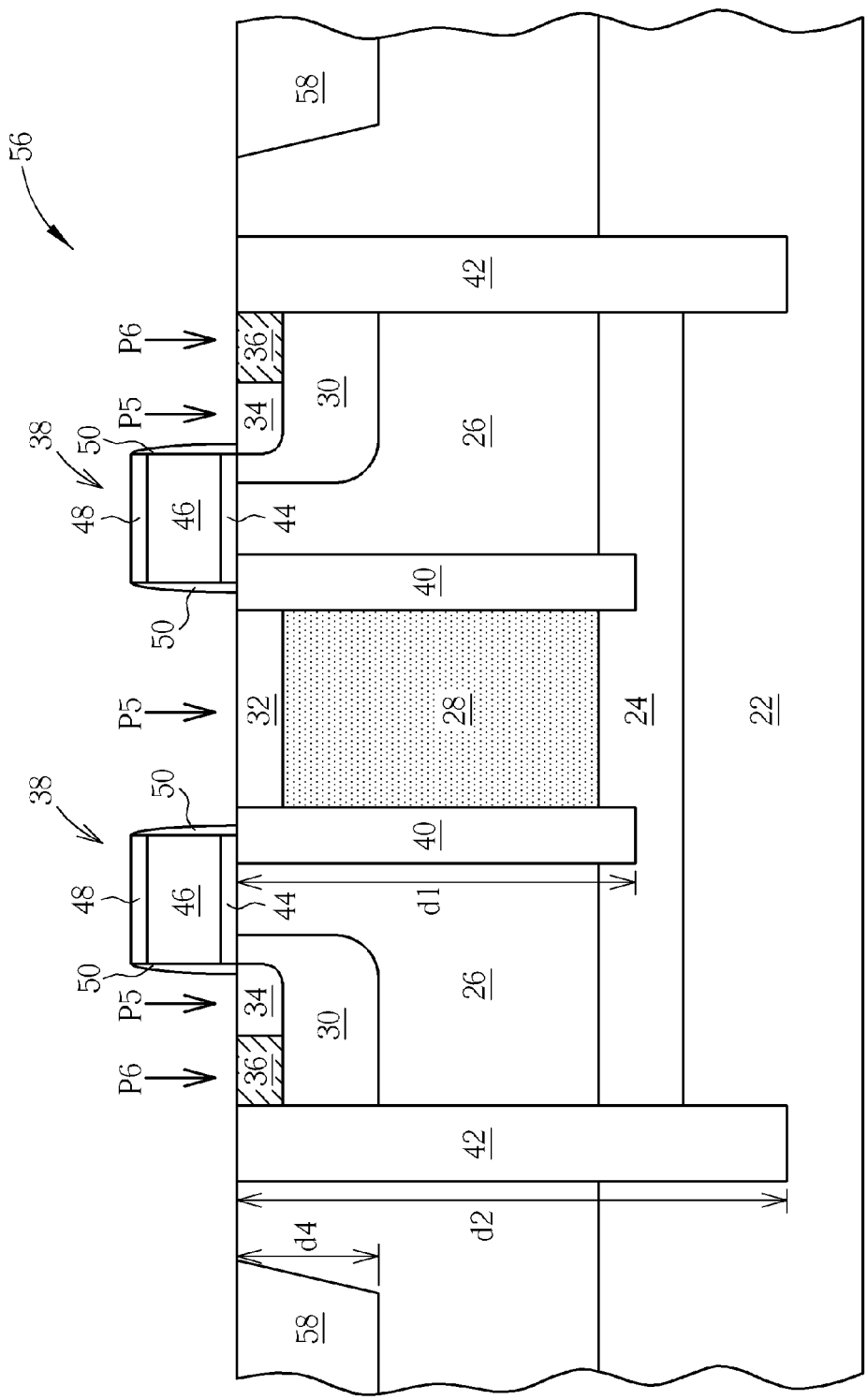

In another exemplary embodiment, as shown in FIG. 10, the semiconductor device 56 may further include a shallow trench structure 58 around for providing additional insulating effects, that is, for avoiding the mutual disturbance between the semiconductor device 56 and other semiconductor devices (not shown) disposed in the semiconductor substrate. The fabricating process of the shallow trench structure 58 could be integrated into the fabricating process of the first trench structure 40 and the second trench structure 42 to save the cost, but not limited thereto. A depth d4 of the shallow trench structure 58 is substantially smaller than the depth d1 of the first trench structure 40 or the depth d2 of the second trench structure 42.

In conclusion, the present invention uses the first trench structure to substitute for the field oxide layer of the conventional semiconductor devices such as LDMOS transistor devices. Accordingly, a part of the horizontal space previously occupied by the semiconductor device may be replaced by the vertical space. Therefore, the first trench structure can provide insulation between the gate and the first heavily doped region, and sufficient vertical space to buffer the high voltage signals transferred from the first heavily doped region, which prevents from damaging the semiconductor device. Consequently, in the present invention, the deposition of the first trench structure which contacts and extends into the buried layer may reduce the horizontal occupied area of semiconductor device in the semiconductor substrate, and the utilization rate of the semiconductor substrate is increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a lateral-diffusion-metal-oxide-semiconductor (LDMOS) device, comprising:
    providing a semiconductor substrate;
    forming a buried layer in the semiconductor substrate;
    forming a well having a first conductivity type in the semiconductor substrate, wherein the well is disposed on the buried layer;
    forming a first trench structure in the well, wherein the first trench structure extends into the buried layer and a bottom surface of the first trench structure not passing through and higher than a bottom surface of the buried layer;
    forming a second trench structure in the semiconductor substrate, wherein a depth of the second trench structure is larger than a depth of the buried layer;
    performing a first ion implantation process to form a first doped region in the well at one side of the first trench structure, wherein the first doped region contacts the buried layer;
    performing a second ion implantation process to form a second well in the well at the other side of the first trench structure, wherein the second well has a second conductivity type and does not contact the buried layer;
    forming at least a gate on the semiconductor substrate, wherein the gate overlaps a part of the well between the first trench structure and the second trench structure;
    forming at least a third doped region in the first doped region; and
    forming at least a second doped region in the second well.

2. The method of fabricating a LDMOS device according to claim 1, wherein the method for forming the well having the first conductivity type comprises:
    forming an epitaxial layer on the buried layer; and
    performing an ion implantation process to form the well in the epitaxial layer.

3. The method of fabricating a LDMOS device according to claim 1, wherein a width of the first trench structure is smaller than a width of the second trench structure.

4. The method of fabricating a LDMOS device according to claim 1, wherein the method for forming the first trench structure and the second trench structure comprises:
    forming a patterned mask on the semiconductor substrate for defining at least a first trench structure region and at least a second trench structure region, wherein a width of the first trench structure region is smaller than a width of the second trench structure region; and
    performing an etching process for forming at least a first trench and at least a second trench, wherein a depth of the first trench is smaller than a depth of the second trench.

5. The method of fabricating a LDMOS device according to claim 4, wherein the method for forming the first trench structure and the second trench structure further comprises:
    performing a thermal oxidation process for forming an oxide layer respectively covering the bottom and the inner sides of the first trench and a bottom and inner sides of the second trench;
    forming a dielectric layer made of oxide for filling the first trench and the second trench; and
    performing a chemical mechanical polishing (CMP) process.

6. The method of fabricating a LDMOS device according to claim 1, wherein the first doped region has a dopant concentration, and the dopant concentration increases progressively from an interface between the first doped region and the buried layer towards an interface between the first doped region and the semiconductor substrate.

7. The method of fabricating a LDMOS device according to claim 1, wherein the first trench structure is between the first doped region and the second doped region.

8. The method of fabricating a LDMOS device according to claim 1, wherein the second trench structure is in the semiconductor substrate at the other side of the gate opposite to the first trench structure.

9. The method of fabricating a LDMOS device according to claim 1, wherein the first conductivity type comprises n-type or p-type, and the second conductivity type comprises the other one.

* * * * *